(12) United States Patent
Shih

(10) Patent No.: US 6,562,670 B2
(45) Date of Patent: May 13, 2003

(54) POLY-SILICON THIN FILM TRANSISTOR AND METHOD FOR FABRICATING THEREOF

(75) Inventor: Po-Sheng Shih, Hsinchu (TW)

(73) Assignee: Hannstar Display Corporation, Taipei (TW)

( * ) Notice: Subject to any disclaimer, the term of this patent is extended or adjusted under 35 U.S.C. 154(b) by 0 days.

(21) Appl. No.: 09/927,797

(22) Filed: Aug. 10, 2001

(65) Prior Publication Data

US 2002/0105029 A1 Aug. 8, 2002

(30) Foreign Application Priority Data

Feb. 2, 2001 (TW) .................................... 90102142 A

(51) Int. Cl.$^7$ .............................................. H01L 21/00
(52) U.S. Cl. ...................... 438/160; 438/162; 438/163; 438/948; 438/942
(58) Field of Search ................................ 438/563, 558, 438/160, 162, 163, 948, 942

(56) References Cited

U.S. PATENT DOCUMENTS

| 5,371,025 A | * | 12/1994 | Sung | 438/160 |
| 5,716,879 A | * | 2/1998 | Choi et al. | 438/40 |
| 5,953,595 A | * | 9/1999 | Gosain et al. | 438/158 |
| 6,019,796 A | * | 2/2000 | Mei et al. | 938/151 |
| 6,077,732 A | * | 6/2000 | Sandhu et al. | 438/158 |

* cited by examiner

Primary Examiner—Amir Zarabian
Assistant Examiner—Christy Novacek
(74) Attorney, Agent, or Firm—J.C. Patents

(57) ABSTRACT

A thin film transistor. The thin film transistor comprises a substrate, a dielectric layer and a polysilicon layer. A gate electrode is located on the substrate. A dielectric layer is located on the substrate and the gate electrode. A polysilicon layer is located on the dielectric layer. The polysilicon layer comprises a channel region and a doped region, wherein the channel region is located above the gate electrode and the doped region is adjacent to the channel region.

8 Claims, 4 Drawing Sheets

POLY-SILICON THIN FILM TRANSISTOR AND METHOD FOR FABRICATING THEREOF

CROSS-REFERENCE TO RELATED APPLICATION

This application claims the priority benefit of Taiwan application serial no. 90102142, filed Feb. 2, 2001.

BACKGROUND OF THE INVENTION

1. Field of Invention

The present invention relates to a technique of manufacturing a photo-electric thin film transistor. More particularly, the present invention relates to a poly-silicon thin film transistor with a self-alignment ability.

2. Description of Related Art

A monitor is a kind of popular device in our daily file, especially for the television and the computer to display images. Typically, the monitor is constructed by a cathode-ray tube, a relatively large space is necessary for assembling a monitor with the cathode-ray tube. Undoubtedly, it is impossible to assemble a laptop with a cathode-ray-tube monitor. Therefore, a plane-display monitor with the dot-matrix design such as a think film transistor liquid crystal display (TFT-LCD) is developed. In the plane-display monitor, pixels of an image arc respectively controlled by thin film transistors.

The structure of a thin film transistor is different from that of a metal oxide semiconductor (MOS). FIGS. 1A through 1E are schematic, cross-sectional views of the conventional method for manufacturing a thin film transistor.

As shown in FIG. 1A, an amorphous silicon 102 is formed on a transparent substrate 100. The amorphous silicon 102 is convened into the polysilicon layer by performing a laser annealing process 104. The polysilicon converted from the amorphous silicon 102 is labeled as a polysilicon 106 (as shown in FIG. 1B).

As shown in FIG. 1B, a gate oxide layer 108 is formed on the polysilicon 106. A gate electrode layer 110 is formed on the gate oxide layer 108.

As shown in FIG. 1C, an implantation process 112 is performed to implant doped ions such as N-type doped ions into the polysilicon 106 and to form a doped region 106a in the polysilicon layer 106 by using the gate electrode 110 as a mask.

As shown in FIG. 1D, the gate electrode 110 is patterned to be shrank into a gate electrode 110a with a relatively small width in order to extend the region 116 between the doped region 106a and the gate electrode 110a. A plasma hydrogenation process (not shown) is performed to compensate the dangling silicon bond in the polysilicon 106.

As shown in FIG. 1E, a metal layer (not shown) is formed over the substrate 100. The metal layer is patterned to form a metal pad 118 on the doped region 106a.

In the conventional process described above, in order to enlarge the region 116, it is necessary to perform an additional photolithography process to pattern the gate electrode 110. Moreover, if the misalignment happens during performing the additional photolithography process, the region 116 at both side of the gate electrode 110a is uneven. Typically, an additional implantation process and annealing process is performed after the gate electrode 110a is formed to form lightly doped region in region 116. Furthermore, the laser annealing process 104 and plasma hydrogenation process are performed individually. Therefore, the process procedures are very complex and the cost is high.

SUMMARY OF THE INVENTION

The invention provides a thin film transistor. The thin film transistor comprises a substrate, a dielectric layer and a polysilicon layer. A gate electrode is located on the substrate. A dielectric layer is located on the substrate and the gate electrode. A polysilicon layer is located on the dielectric layer. The polysilicon layer comprises a channel region and a doped region, wherein the channel region is located above the gate electrode and the doped region is adjacent to the channel region.

The invention provides a method of manufacturing a thin firm transistor. A substrate having a gate electrode formed thereon is provided. A gate dielectric layer, an amorphous silicon layer, a silicon-bond-protection layer and a photoresist layer are formed over the substrate in sequence. The silicon-bond-protection dielectric layer comprises elements for compensating dangling silicon bonds. The photoresist layer is patterned by using the gate electrode as a mask and by exposuring the photoresist layer from the bottom of the substrate. A thermal reflow process is performed to laterally extend the patterned photoresist. The bottom of the soften photoresist is larger than the gate electrode. A portion of the silicon-bond protection layer is removed to expose a portion of the amorphous silicon layer by using the photoresist as a mask. A doped dielectric layer is formed over the substrate. A thermal annealing process is performed to convert silicon the amorphous layer into a polysilicon layer. Simultaneously, dopants in the doped doelectric layer diffuse into the polysilicon layer to form a doped region and elements in the silicon-bond-protection layer diffuse into the polysilicon layer to form a channel region. The silicon-bond-protection layer and the doped dielectric layer are removed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A through 2E are schematic, cross-sectional views of the process for manufacturing a thin film transistor in a preferred embodiment according to the invention.

Figure 1A:
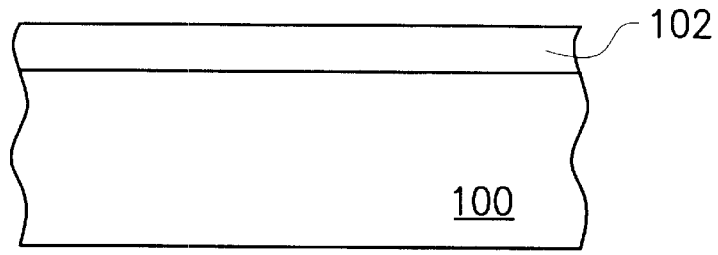
FIGS. 1A through 1E are schematic, cross-sectional views of the conventional method for manufacturing a thin film transistor.
Figure 1B:
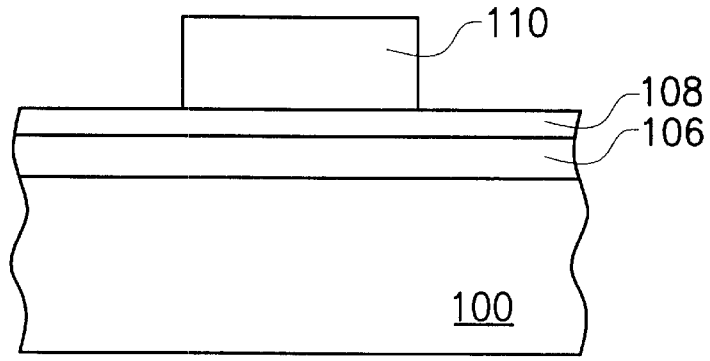
Figure 1C:
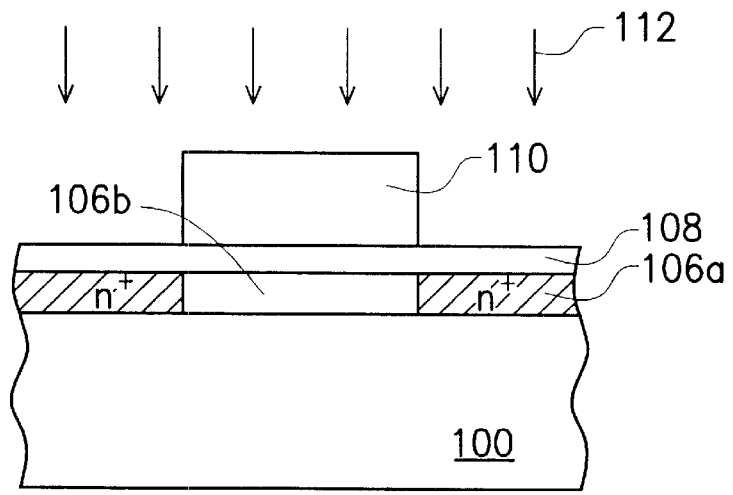
Figure 1D:
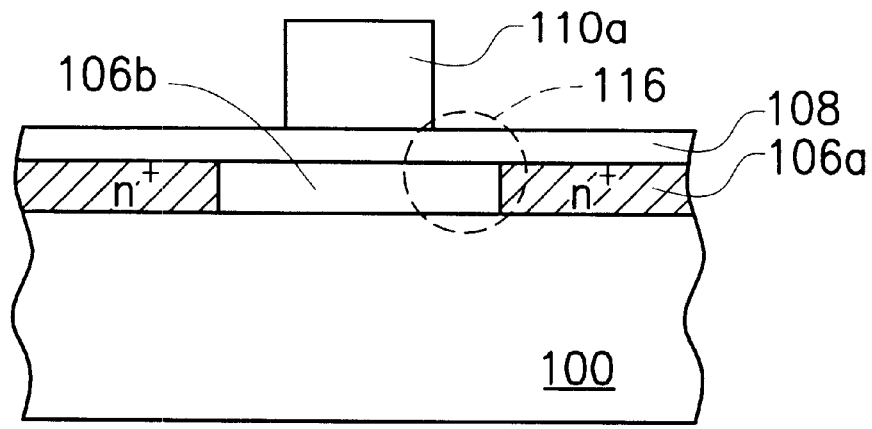
Figure 1E:
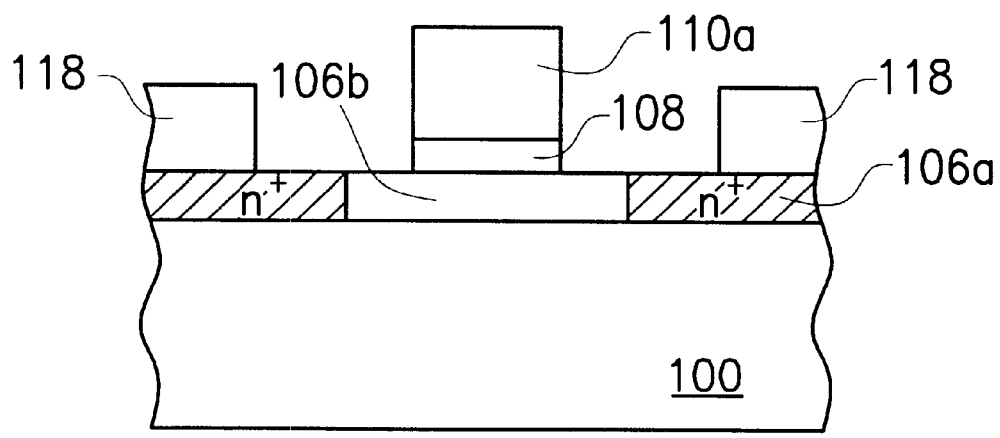
Figure 2A:
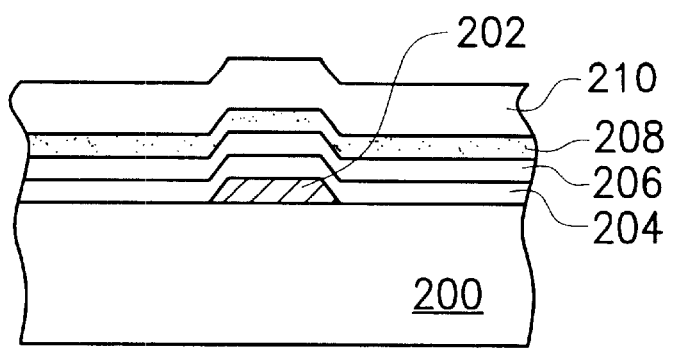
FIGS. 2A through 2E are schematic, cross-sectional views of the process for manufacturing a thin film transistor in a preferred embodiment according to the invention.

As shown in FIG. 2A, a transparent substrate 200 is provided. A gate electrode 202 is formed on the substrate. In order to deposit other material layer more easily in the subsequent process steps, the gate electrode 202 is formed with a trapezoid shape. The thickness of the gate electrode 202 is of about 3000 angstroms. A gate dielectric layer 204 is formed over the substrate 200. The gate dielectric layer 204 is formed of silicon oxide, for example. Because of the obliquity of the sidewall of the gate electrode 202, the gate dielectric layer 204 can well cover the gate electrode 202. An amorphous silicon layer 206 is formed on the gate dielectric layer 204. The thickness of the amorphous silicon layer 206 is of about 200–2000 angstroms. A silicon-bond-protection layer 208 is formed on the amorphous silicon layer 206. The thickness of the silicon-bond-protection layer 208 is of about 1000–1500 angstroms. The silicon-bond-protection layer 208 possesses elements for compensating dangling silicon bond. The elements can be hydrogen or fluorine, for example. Preferably, the silicon-bond protection layer is formed of fluorinated silicon oxide or silicon hydroxide. A photoresist layer 210 is formed on the silicon-bond-protection layer 208. The thickness of the photoresist layer 210 is of about 1–4 micro-meters. An exposure process 211 is performed to pattern the photoresist layer 210 by irradiating lights from the bottom of the transparent substrate to the photoresist layer 210 with using the gate electrode 202 as a mask. Therefore, the pattern of the gate electrode 202 is duplicated onto the photoresist layer 210.

Figure 2B:
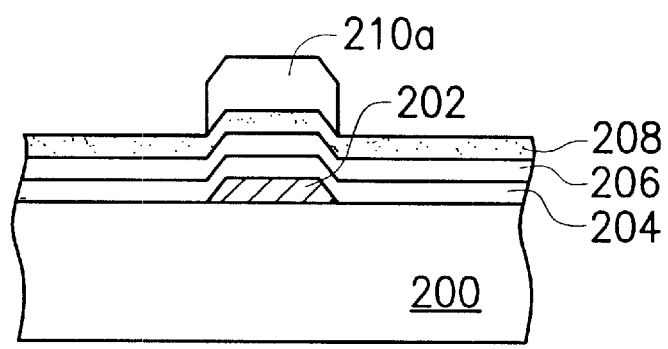

As shown in FIG. 2B, a portion of the photoresist layer 210 is removed to form a photoresist mask 210a. Hence, the photoresist mask 210a is self-aligned to the gate electrode 202.

Figure 2C:
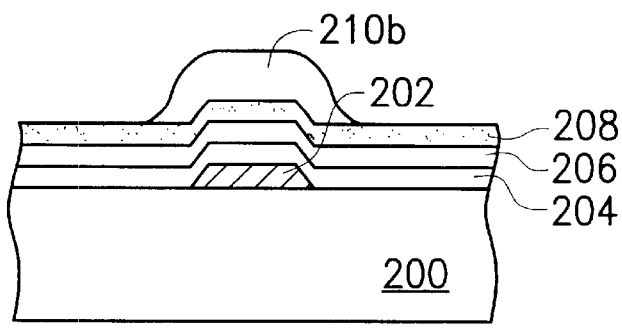

As shown in FIG. 2C, a thermal reflow process is performed to soften the photomask 210a into a photomask 210b. The thermal reflow process is performed under a temperature of about 100–250 degree Celsius. Because of the thermal reflow process, the bottom of the photomask 210a is laterally extended and the ratio of the bottom of the photomask 210b to that of the photomask 210a is of about 4/3. Hence, the bottom of the photomask 210b is slightly larger than the bottom of the gate electrode 202. Since the photomask 210a is self-aligned formed over the substrate 200, the photomask 210b is also self-aligned to the gate electrode 202 even after the thermal reflow process. Therefore, there is no misalignment phenomenon.

Figure 2D:
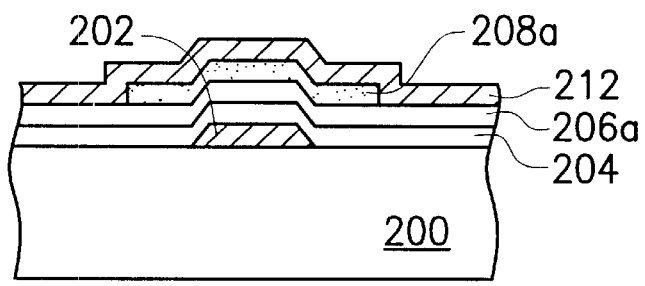

As shown in FIG. 2D, the silicon-bond-protection layer 208 is patterned to expose a portion of the amorphous silicon layer 206 and to form a silicon-bond-protection layer 208a by using the photomask 210b as a mask. Since the bottom of the photomask 210b is slightly larger than the bottom of the gate electrode 202, the silicon-bond-protection layer 208a is larger than the gate electrode 202. The photomask 210b is removed. A doped dielectric layer 212 is formed over the substrate 200. The doped dielectric layer 212 can be formed of borosilicate glass (LBSG), borophosphosilicate glass (BPSG) or phosphosilicate glass (PSG), for example. The dosage of the dopants in the doped dielectric layer 212 is of about $10e14$–$10e15$ ions/cm$^2$. The doped dielectric layer 212 can be as thick as the silicon-bond-protection layer 208a.

Figure 2E:
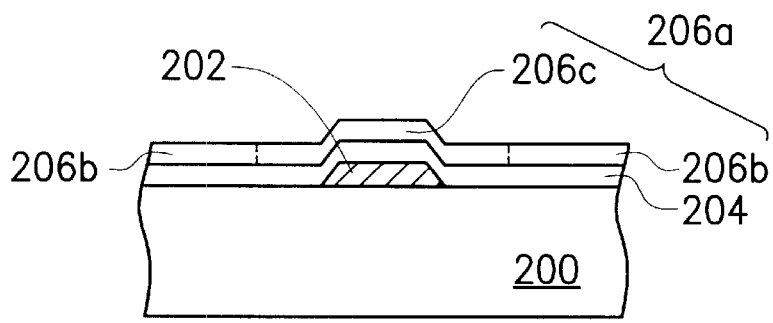

As shown in FIG. 2E, a thermal annealing process is performed to convert amorphous silicon layer 206 (as shown in FIG. 2C) into a polysilicon layer 206a. The doped dielectric layer 212 and the silicon-bond-protection layer 208a are removed. The thermal annealing process can be a laser annealing process performed under about 100–400 mJ, for example. During the thermal annealing process, the dopants in the doped dielectric layer 212 self-alignedly diffuse into the polysilicon layer 206a to form a doped region 206b and the elements such as hydrogen and fluorine in the silicon-bond-protection layer 208a self-alignedly diffuse into the polysilicon layer 206a to form a channel region 206c. Because the silicon-bond-protection layer 208a is larger than the gate electrode 202, the compensation region between the margent of the doped region 206b and the region right above the gate electrode 202 is relatively large.

In the present invention, because the compensation region in the polysilicon layer 206a is formed self-alignedly, it is unnecessary to perform additional photolithography to shrink the gate electrode and the compensation region formed adjacent to the gate electrode can be formed symmetrically. Incidentally, since the doped region and the channel region are self-alignedly formed in the polysilicon layer simultaneously with the conversion of the amorphous silicon layer into the polysilicon layer, the process procedure is greatly simplified. Hence, the cost is decreased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a thin film transistor, comprising:

providing a substrate having a gate electrode formed thereon;

forming a gate dielectric layer, an amorphous silicon layer, a silicon-bond-protection layer and a photoresist layer over the substrate in sequence, wherein the silicon-bond-protection dielectric layer comprises elements for compensating dangling silicon bonds;

patterning the photoresist layer by exposing the photoresist layer from the bottom of the substrate using the gate electrode as a mask;

processing a thermal reflow process to laterally extend the patterned photoresist layer, wherein the bottom of the softened photoresist layer is larger than the gate electrode;

removing a portion of the silicon-bond-protection layer to expose a portion of the amorphous silicon layer by using the patterned photoresist layer as a mask;

forming a doped dielectric layer over the substrate;

performing a thermal annealing process to convert the amorphous silicon layer into a polysilicon layer, wherein dopants in the doped dielectric layer diffuse into the polysilicon layer to form a doped region and elements in the silicon-bond-protection layer diffuse into the polysilicon layer to form a channel region; and removing the silicon-bond-protection layer and the doped dielectric layer.

2. The method of claim 1, wherein the thermal annealing process comprises a laser annealing process.

3. The method of claim 2, wherein an energy of the laser annealing process is of about 100–400 mJ.

4. The method of claim 1, wherein the silicon-bond-protection layer is selected from a group consisting of a fluorinated silicon oxide, and a silicon hydroxide.

5. The method of claim 1, wherein the silicon bond protective dielectric layer comprises silicon hydroxide.

6. The method of claim 1, wherein the doped dielectric layer is formed of borosilicate glass.

7. The method of claim 1, wherein the doped dielectric layer is formed of phosphosilicate glass.

8. The method of claim 1, wherein the thermal reflow process is performed under a temperature of about 100–250 degree Celsius.

* * * * *